(12) United States Patent
Ashwood et al.

(10) Patent No.: US 10,042,187 B2
(45) Date of Patent: Aug. 7, 2018

(54) HEAT MANAGEMENT FOR ELECTRONIC DEVICES

(71) Applicant: Snap Inc., Venice, CA (US)

(72) Inventors: Andrea Ashwood, Los Angeles, CA (US); Ashutosh Y. Shukla, Los Angeles, CA (US); Stephen Andrew Steger, Santa Monica, CA (US)

(73) Assignee: Snap Inc., Venice, CA (US)

( * ) Notice: Subject to any disclaimer, the term of this patent is extended or adjusted under 35 U.S.C. 154(b) by 6 days.

(21) Appl. No.: 15/425,774

(22) Filed: Feb. 6, 2017

(65) Prior Publication Data

US 2018/0136491 A1 May 17, 2018

Related U.S. Application Data

(63) Continuation-in-part of application No. 15/073,856, filed on Mar. 18, 2016, now Pat. No. 9,851,585, and
(Continued)

(51) Int. Cl.
*G02C 5/14* (2006.01)
*G02C 11/00* (2006.01)
(Continued)

(52) U.S. Cl.
CPC .............. *G02C 11/10* (2013.01); *G02C 5/008* (2013.01); *G02C 5/14* (2013.01); *G02C 5/22* (2013.01);
(Continued)

(58) Field of Classification Search
CPC .......... G02C 11/10; G02C 5/14; G02C 5/008; G02C 5/22; G02C 2200/10; H05K 7/2039; H05K 5/0086
(Continued)

(56) References Cited

U.S. PATENT DOCUMENTS 6,038,295 A 3/2000 Mattes
6,980,909 B2 12/2005 Root et al.
(Continued)

FOREIGN PATENT DOCUMENTS

CA 2887596 A1 7/2015
WO WO-0135159 A1 5/2001
WO 2017151519 9/2017

OTHER PUBLICATIONS

"U.S. Appl. No. 15/073,856, Non Final Office Action dated Mar. 9, 2017", 7 pgs
(Continued)

*Primary Examiner* — Tuyen Tra
(74) *Attorney, Agent, or Firm* — Schwegman Lundberg & Woessner, P.A.

(57) ABSTRACT

Apparatuses and systems are disclosed and can include a case for eyewear having an eyewear body carrying onboard electronic components that comprise a heat source that generates heat during electrically powered operation is disclosed. The case can hold the eyewear when the eyewear are in a stowed position. The case can further include one or more supports to support the eyewear in the stowed position within the holding space. One or more heat sinks are integrated with the one or more supports. Each of the one or more heat sinks are thermally conductive coupled with a corresponding heat sink of the eyewear. A first heat conduction pathway is thermally connected to the one or more heat sinks and can extend into the case body to conduct heat from the heat source into the case with the eyewear supported in the stowed position.

20 Claims, 7 Drawing Sheets

Related U.S. Application Data a continuation-in-part of application No. 15/084,683, filed on Mar. 30, 2016, now Pat. No. 9,740,023.

(60) Provisional application No. 62/301,061, filed on Feb. 29, 2016.

(51) Int. Cl.
*G02C 5/00* (2006.01)
*G02C 5/22* (2006.01)
*H05K 5/00* (2006.01)
*H05K 7/20* (2006.01)

(52) U.S. Cl.
CPC ......... *H05K 5/0086* (2013.01); *H05K 7/2039* (2013.01); *G02C 2200/10* (2013.01)

(58) Field of Classification Search
USPC .......................................... 351/41, 111, 121
See application file for complete search history.

(56) References Cited

U.S. PATENT DOCUMENTS

| | | | |
|---|---|---|---|
| 7,173,651 B1 | 2/2007 | Knowles | |
| 7,411,493 B2 | 8/2008 | Smith | |
| 7,535,890 B2 | 5/2009 | Rojas | |
| 8,131,597 B2 | 3/2012 | Hudetz | |
| 8,199,747 B2 | 6/2012 | Rojas | |
| 8,332,475 B2 | 12/2012 | Rosen et al. | |
| 8,718,333 B2 | 5/2014 | Wolf et al. | |
| 8,724,622 B2 | 5/2014 | Rojas | |
| 8,874,677 B2 | 10/2014 | Rosen et al. | |
| 8,909,679 B2 | 12/2014 | Roote et al. | |
| 8,995,433 B2 | 3/2015 | Rojas | |
| 9,040,574 B2 | 5/2015 | Wang et al. | |
| 9,055,416 B2 | 6/2015 | Rosen et al. | |
| 9,100,806 B2 | 8/2015 | Rosen et al. | |
| 9,100,807 B2 | 8/2015 | Rosen et al. | |
| 9,191,776 B2 | 11/2015 | Root et al. | |
| 9,204,252 B2 | 12/2015 | Root | |
| 9,443,227 B2 | 9/2016 | Evans et al. | |
| 9,482,882 B1 | 11/2016 | Hanover et al. | |
| 9,482,883 B1 | 11/2016 | Meisenholder | |
| 9,489,661 B2 | 11/2016 | Evans et al. | |
| 9,491,134 B2 | 11/2016 | Rosen et al. | |
| 9,740,023 B1 | 8/2017 | Ashwood | |
| 2008/0198324 A1 | 8/2008 | Fuziak et al. | |
| 2010/0309426 A1 | 12/2010 | Howell et al. | |
| 2011/0202598 A1 | 8/2011 | Evans et al. | |
| 2011/0221656 A1 | 9/2011 | Haddick et al. | |
| 2012/0155064 A1 | 6/2012 | Waters | |
| 2012/0209924 A1 | 8/2012 | Evans et al. | |
| 2014/0259271 A1 | 9/2014 | Cox et al. | |
| 2014/0368544 A1 | 12/2014 | Kobayashi | |
| 2015/0200554 A1* | 7/2015 | Marks | H02J 7/0044 320/108 |
| 2016/0041395 A1 | 2/2016 | Yajima | |
| 2016/0212888 A1 | 7/2016 | Nikkhoo et al. | |
| 2016/0252727 A1 | 9/2016 | Mack et al. | |
| 2017/0248801 A1 | 8/2017 | Ashwood | |

OTHER PUBLICATIONS

"U.S. Appl. No. 15/073,856, Response dated May 22, 2017 to Non Final Office Action dated Mar. 9, 2017", 9 pgs.

"U.S. Appl. No. 15/084,683, Corrected Notice of Allowance dated Jun. 20, 2017", 3 pgs.

"U.S. Appl. No. 15/084,683, Non Final Office Action dated Dec. 1, 2016", 11 pgs.

"U.S. Appl. No. 15/084,683, Notice of Allowance dated Apr. 12, 2017", 7 pgs.

"U.S. Appl. No. 15/084,683, PTO Response to Rule 312 Communication dated Jun. 30, 2017", 2 pgs.

"U.S. Appl. No. 15/084,683, Response dated Feb. 28, 2017 to Non Final Office Action dated Dec. 1, 2016", 10 pgs.

"U.S. Appl. No. 15/086,233, Non Final Office Action dated Dec. 21, 2016", 12 pgs.

"International Application Serial No. PCT/US2017/019740, International Search Report dated Jun. 2, 2017", 5 pgs.

"International Application Serial No. PCT/US2017/019740, Written Opinion dated Jun. 2, 2017", 9 pgs Leyden, John, "This SMS will self-destruct in 40 seconds", [Online]. Retrieved from the Internet: <URL: http://www.theregister.co.uk/2005/12/12/stealthtext/, (Dec. 12, 2005), 1 pg.

Lin, Jun, "Eyewear with conductive Temple Joint", U.S. Appl. No. 14/869,149, filed Sep. 29, 2015, (Sep. 29, 2015), 33 pgs.

\* cited by examiner

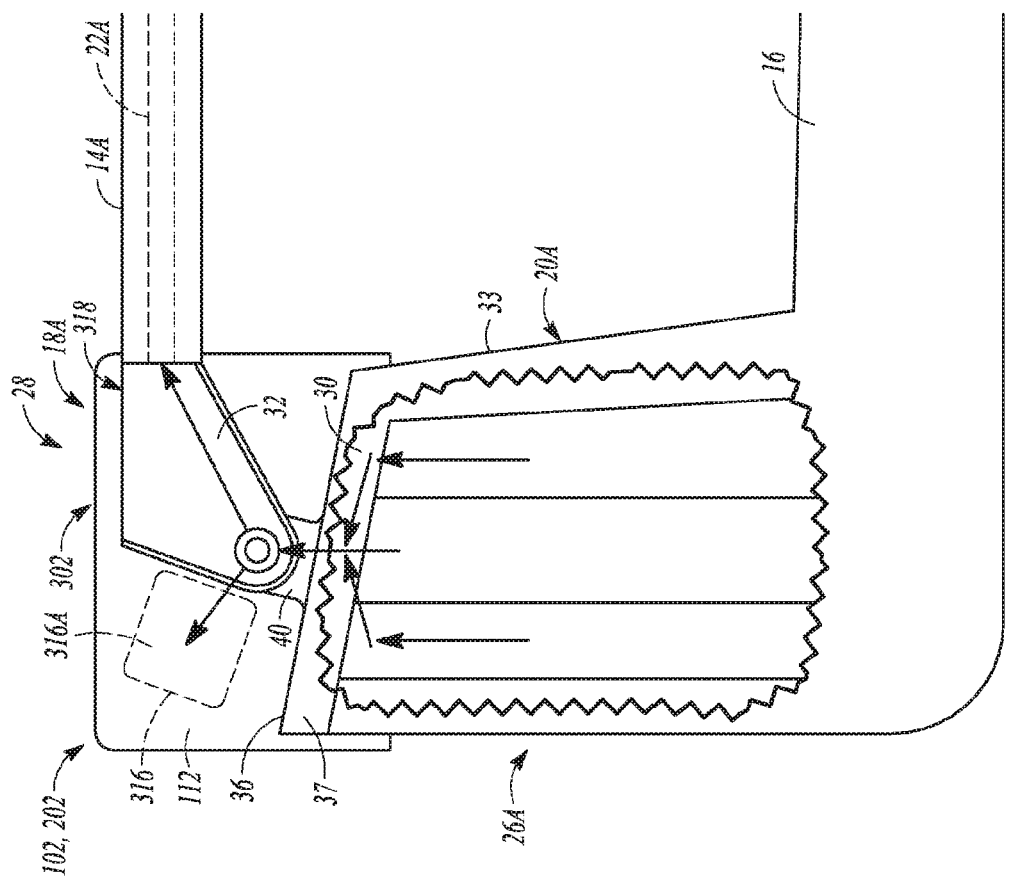

HEAT MANAGEMENT FOR ELECTRONIC DEVICES

CLAIM OF PRIORITY

This application claims the benefit of priority of U.S. Provisional Application Ser. No. 62/301,061, filed Feb. 29, 2016. U.S. application Ser. No. 15/073,856, filed Mar. 18, 2016, and U.S. application Ser. No. 15/084,683, filed Mar. 30, 2016, each of which is hereby incorporated by reference in its entirety.

TECHNICAL FIELD

The subject matter disclosed herein generally relates to conducting heat from electronic devices. More specifically, the present disclosure discloses apparatuses, systems and techniques used to conduct heat from electronics housed within a wearable device.

BACKGROUND

Many devices, including wearable devices, utilize electronics to perform various functions. Many of these devices have small form factors. Use of on-board electronics generates heat. Overheating can result due to the small form factor used in housing the electronics. Such overheating is undesirable, as it can damage device components or lead to the perception by the user that the device is being overused.

BRIEF DESCRIPTION OF THE DRAWINGS

The present disclosure is illustrated by way of example, and not by way of limitation, in the figures of the accompanying drawings, in which:

FIG. 5A is a first plan view of the ledge and heat conduction pathway of the case and a portion of the frame housing the electronics and further illustrating heat being conducted from the frame to the heat conduction pathway according to one embodiment.

OVERVIEW

A brief overview of some aspects of the disclosure with reference to selected drawings follows, after which various features of the disclosed subject matter will be described in greater detail.

Figure 1:
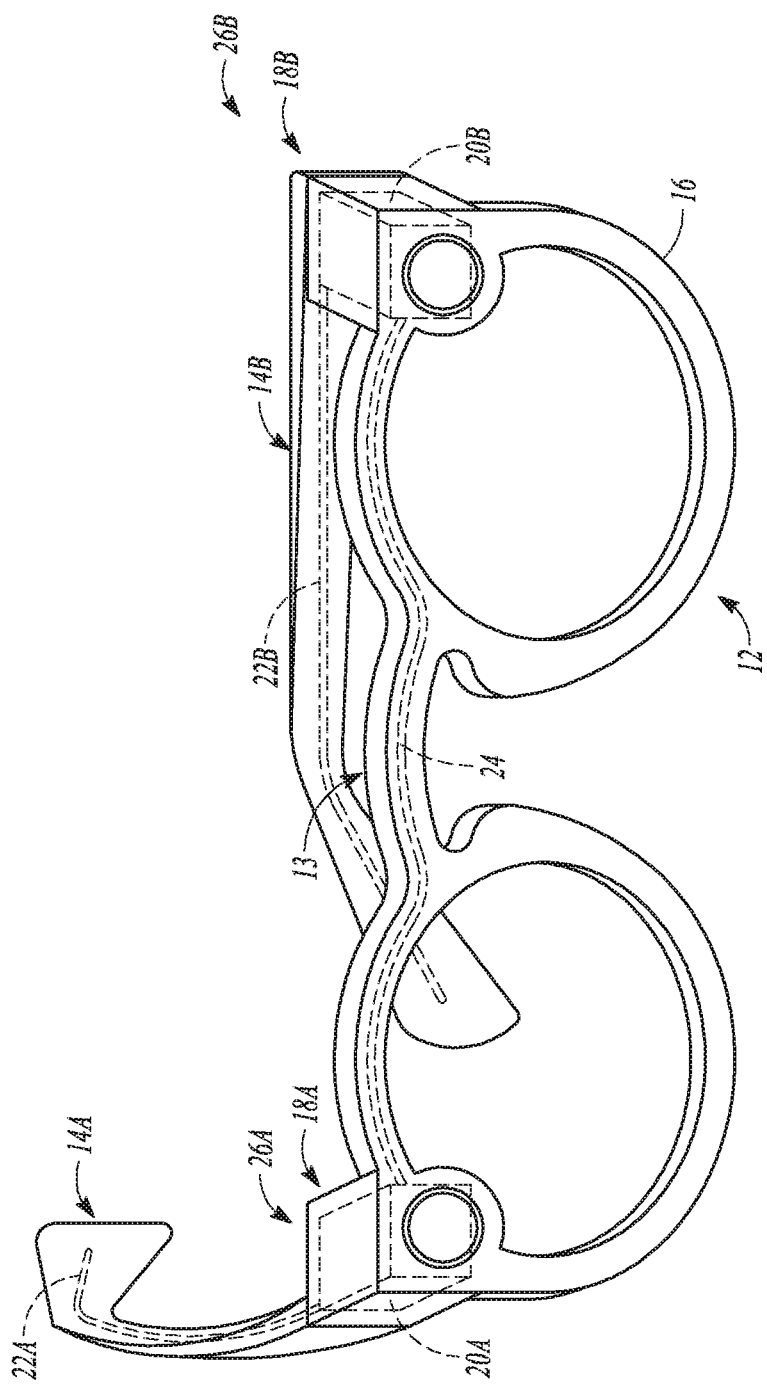
FIG. 1 is a plan view of eyewear comprising a wearable electronic device including temples, a frame, onboard electronic components housed in the frame according to one embodiment.
Figure 5B:
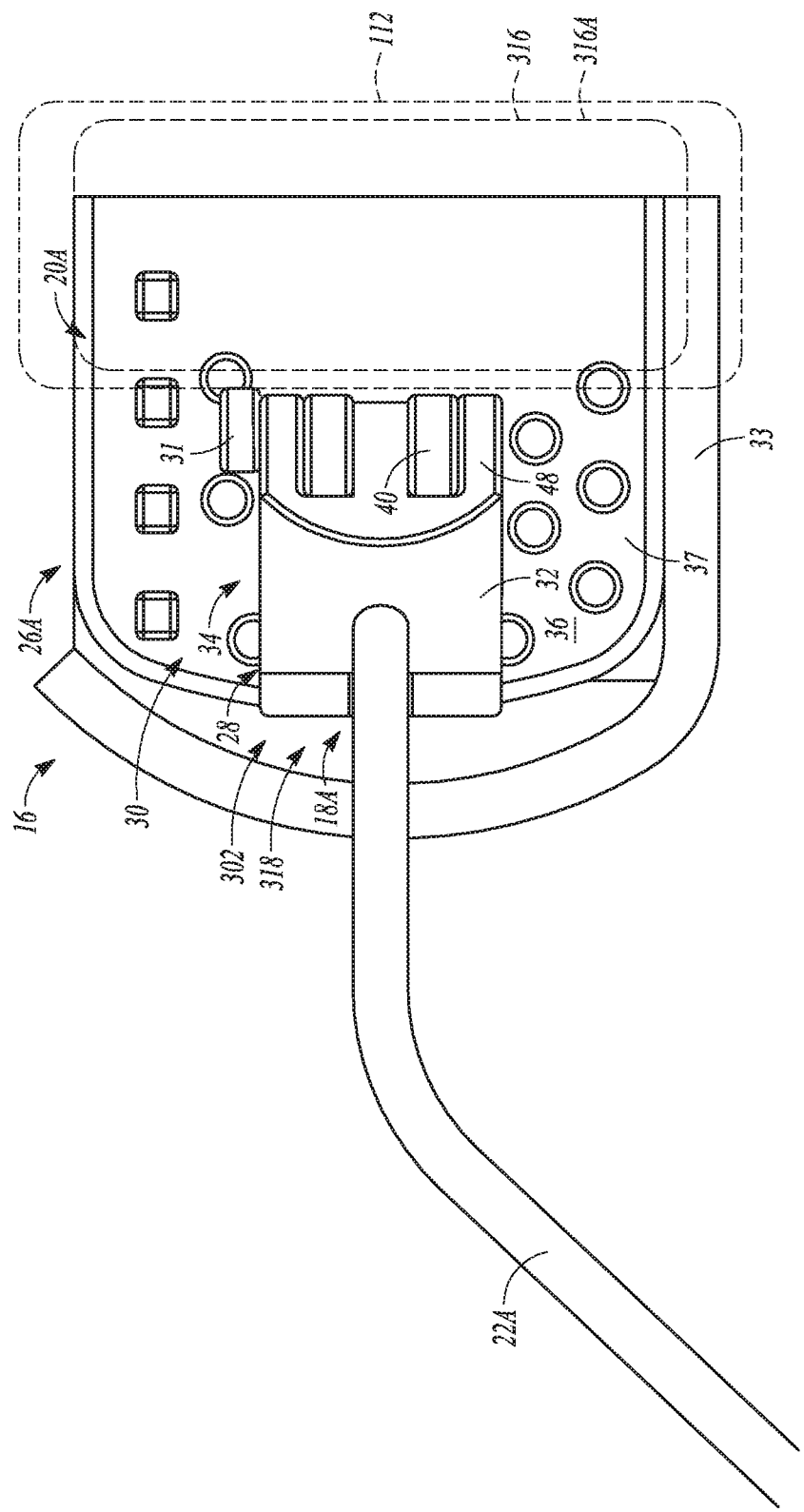
FIG. 5B is perspective view of a rear portion of the frame, the ledge and heat conduction pathway of the case and further illustrating heat being conducted from the frame to the heat conduction pathway the according to one embodiment.
Figure 6:
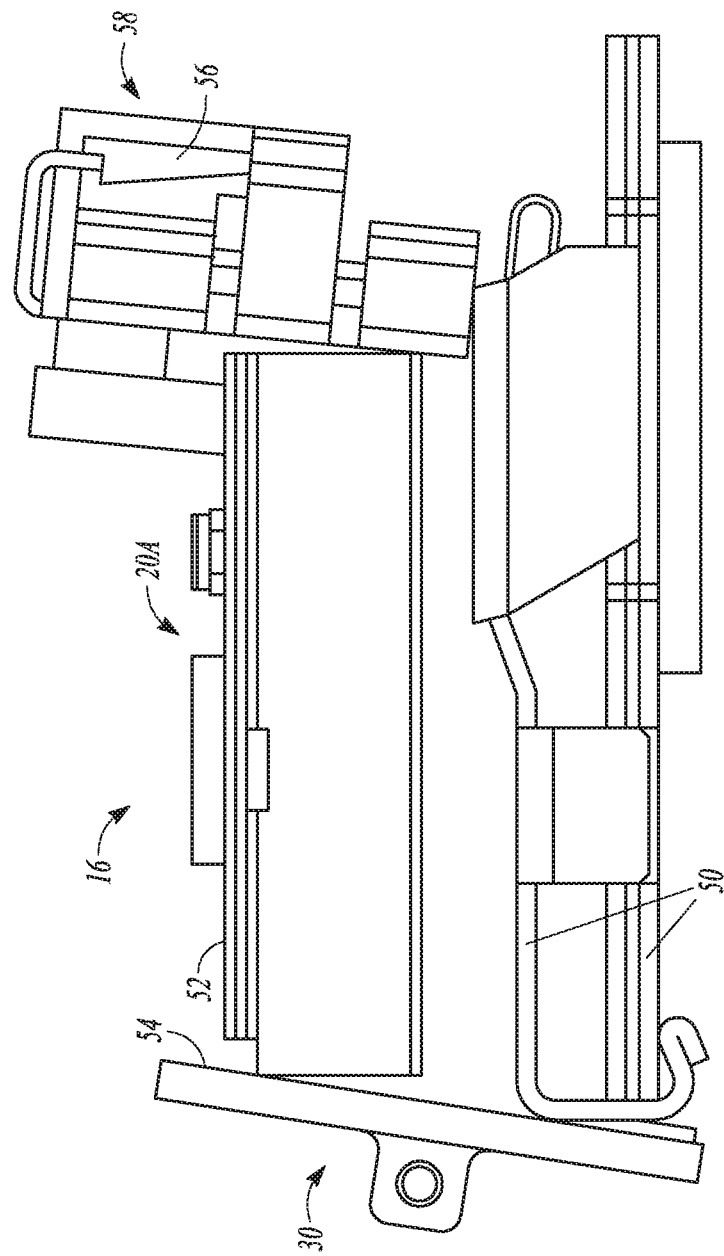
FIG. 6 is a perspective view of the onboard electronic components, a thermal coupling, and a hinge assembly with portions of the frame and temples removed according to one embodiment.

One aspect of this disclosure relates to small form electronic devices, such as an eyewear article with onboard electronic components such as a camera, a processor, WiFi module, and various other modules as is shown in FIGS. 1, 2 and 5A-6. Such eyewear articles are referred to herein as smart glasses. The onboard electronic components are carried by the smart glasses, being located as in the frame (as illustrated in FIGS. 1, 5A and 6) and/or in the temple(s). The onboard electronic components can generate large amounts of heat relative to the form factor during electrically powered operation of the smart glasses. For smart glasses, it is desirable for the onboard electronics components housed in a manner that does not make the smart glasses unsightly or ungainly for the user. Although these criteria can be satisfied by making the onboard electronic components or the housing for those components smaller, such reduction in size/volume and corresponding reduction in surface area can pose heat management problems. Inadequate heat transfer away from the electronics can eventually lead to failure of the onboard electronics components or can lead to undesirable external surface heating of the smart glasses. Such external surface heating can negatively affect user experience (e.g., can cause discomfort to the user or a perception on the part of the user that the onboard electronics components are being overworked).

The smart glasses are disposable in two major configurations. In a stowed position, one or both of the temples are folded by the frame to a non-wearable position for the user. In a wearable position, both of the temples are extended so as to be received around a user's face. The onboard electronic components of the smart glasses can run software to perform tasks in the stowed position or the wearable position. For example, the tasks include transferring data, capturing sensor data, managing power usage, and so on. Performance of the tasks in such stowed position can improve the glasses' efficiency and user experience by allowing the tasks to be performed even when the smart glasses are not fully put to use being worn by the user.

Accordingly, various heat transfer solutions are described to manage heat transfer away from heat sources in the onboard electronics of the smart glasses, to and prevent excessive heat buildup. For example, a heat conduction pathway internal to the smart glasses for transferring heat away from the onboard electronic components toward the back of the frame or to the temple(s) along a core wire. In some embodiments, such an internal heat transfer pathway can include a thermal coupling between the temple and the frame to conduct heat across the articulated joint both when the temple(s) is in the wearable position and when the temple is in the stowed position.

Instead, or in addition, an external heat conduction pathway is in some example embodiments provided to conduct heat externally to the smart glasses. The external heat conduction pathway is in some embodiments provided by a case or carrier (e.g., FIGS. 2-5B) that can be used to house the smart glasses in the stowed position. The external heat conduction pathway in such embodiments conducts heat away from the onboard electronic components and smart glasses and into designated portions of the case. By utilizing the external heat conduction pathway, data transfer rates from the smart glasses, using WiFi network connection or another communication modality, can be increased (relative to rates where the smart glasses are worn by the user) with the smart glasses disposed in the case.

According to some examples, the case can have a port (e.g., FIGS. 4A and 4B) for data and/or power transfer to a mating port on the smart glasses. In these examples, the case can be used for recharging of a battery of the smart glasses in addition to providing a heat transfer pathway, for example.

Figure 3:
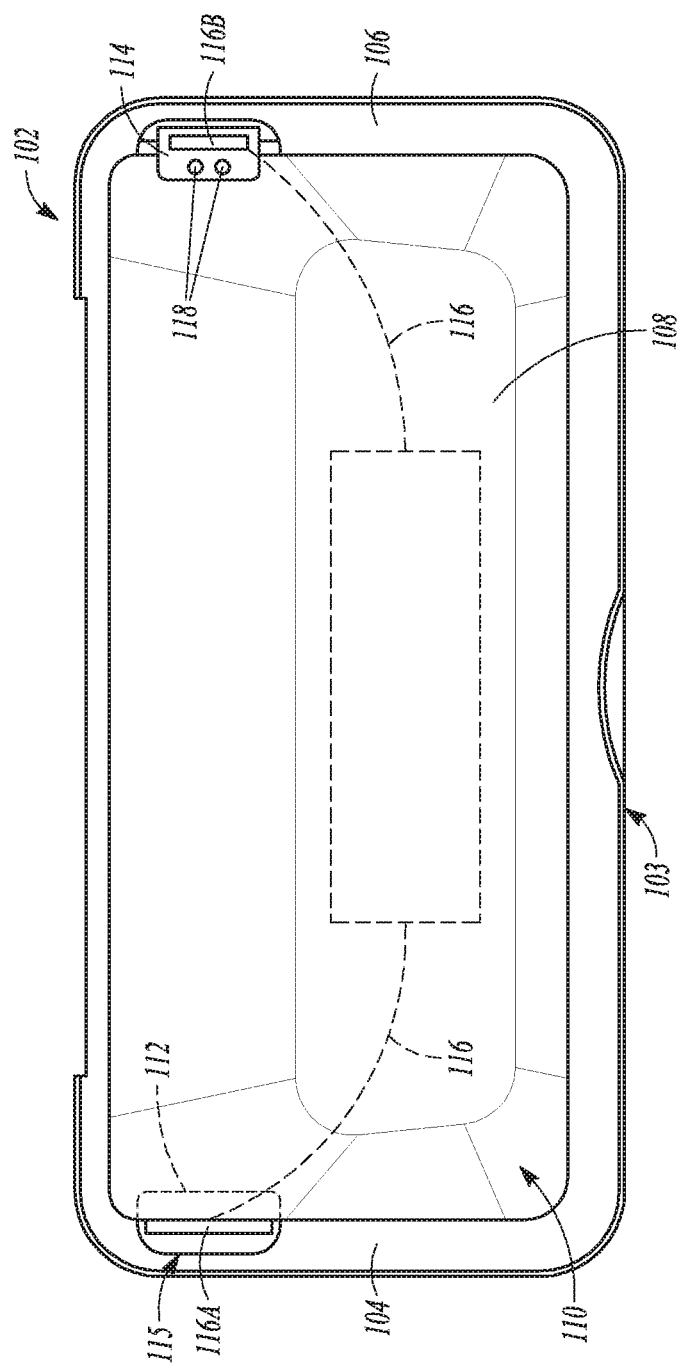
FIG. 3 is a perspective view of the case with the eyewear removed showing ledges, a docking port, and a portion of the heat conduction pathway according to one embodiment.
Figure 4:
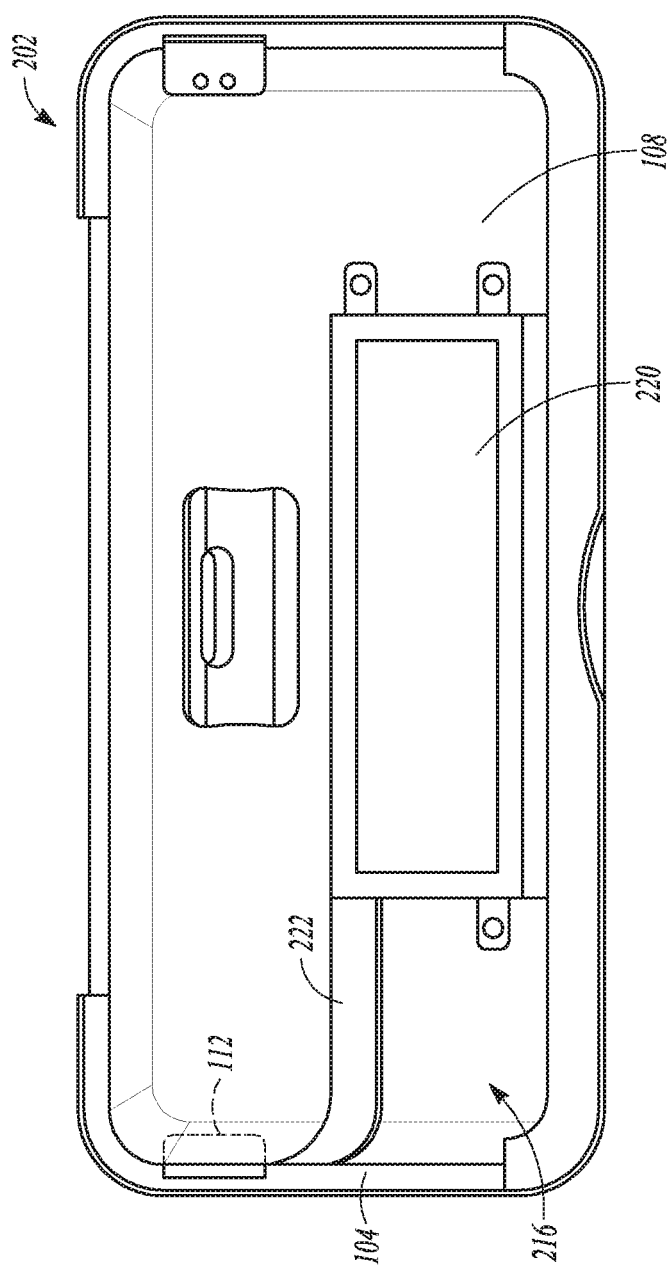
FIG. 4 is a perspective view of a second embodiment of the case with portions of the case removed to illustrate a second embodiment of the heat conduction pathway.

Thus, the disclosed thermal coupling transfers heat generated by the onboard electronic components away therefrom and away from the smart glasses to the case. This reduces the likelihood of localized heating adjacent the onboard electronic components. Furthermore, the smart glasses and the case that can provide for the thermal coupling between the smart glasses and the case. More particularly, the thermal coupling can extend internally within the frame, from a backside of the temples adjacent a hinge assembly between the temple and the frame and along the case to facilitate a more desirable heat transfer path of the heat away from the onboard electronic components to the case as shown in FIGS. 2-5B. According to some embodiments, the thermal coupling can include a cap hinge. The cap hinge is part of the thermal coupling as well as the housing of the frame and the hinge assembly (e.g., FIGS. 5A-6). As shown in FIGS. 5A and 6, the cap hinge abuts one or more internal surfaces disposed within the frame to form a conductive heat exchange relationship. In particular, the cap hinge abuts one or more heat sinks internal to the frame. These internal heat sinks carry the onboard electronics components thereon. Thus, according an example, a conductive heat conduction pathway is formed from the internal heat sinks to the cap hinge and from the cap hinge to the second heat transfer pathway in the case as shown in FIGS. 2-5B.

Figure 2:
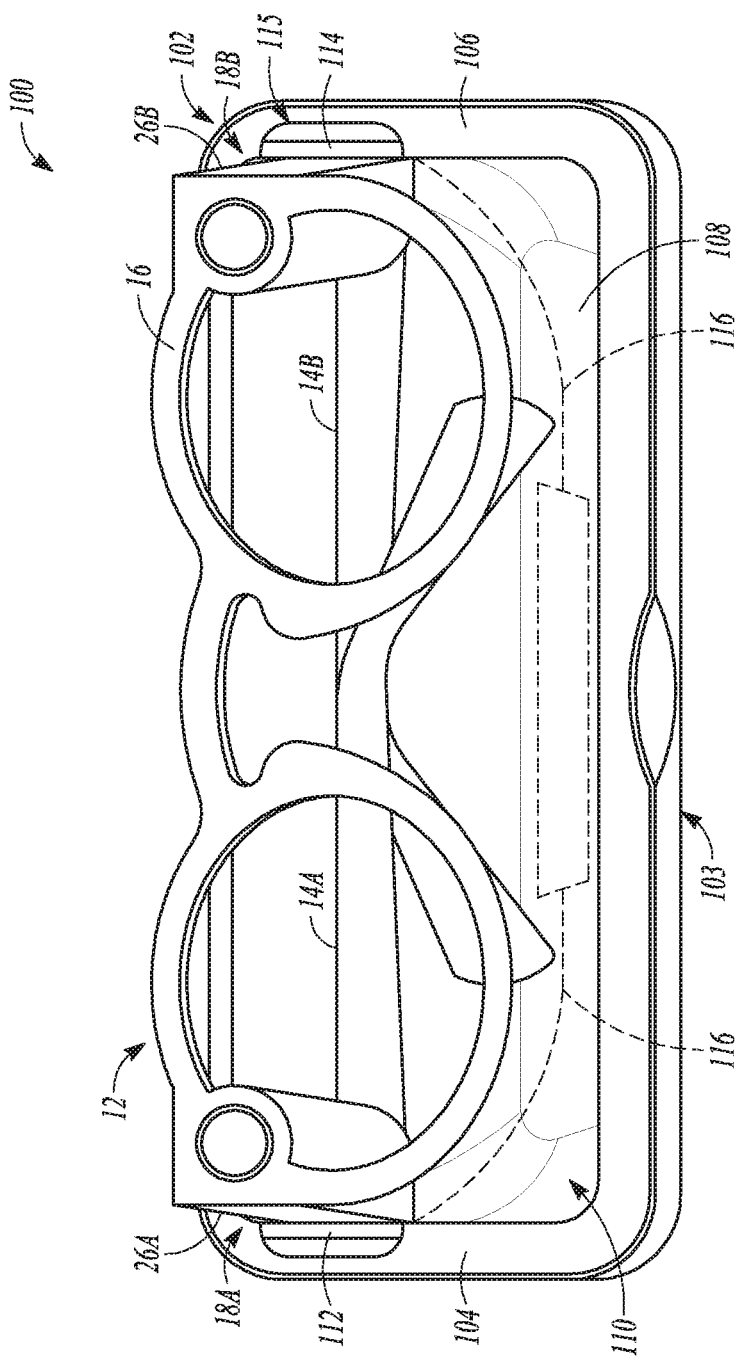
FIG. 2 is a perspective view of the eyewear disposed in a case and a heat conduction pathway from the eyewear into the case according to one embodiment.

In some examples, either the frame (on one or both sides), both the frame and the temple(s), or at least one of the temples carries the onboard electronic components. Similarly, the second heat conduction pathway can be part of both sides of the case as shown in FIGS. 2 and 3 or one side of the case as shown in FIG. 4. Thus, the onboard electronic components and heat conduction pathways can be disposed on both the left and right side portions of the frame and each respective left and right side of the case according to some embodiments.

DETAILED DESCRIPTION

The description that follows includes apparatuses, systems, and techniques that embody illustrative embodiments of the disclosure. In the following description, for the purposes of explanation, numerous specific details are set forth in order to provide an understanding of various embodiments of the inventive subject matter. It will be evident, however, to those skilled in the art, which embodiments of the inventive subject matter maybe practiced without these specific details. In general, well-known structures and techniques are not necessarily shown in detail. Certain embodiments described in detail herein may be referred to as examples.

Embodiments described herein relate to apparatuses, systems and techniques that provide for heat management in smart glasses by conducting heat away from onboard electronic components to off-board and/or off-device heat sink(s). This can include conducting the heat into a holding case for the smart glasses. These arrangements can make the smart glasses as more reliable and wearable for the user. For example, conducting heat into the case and away from the onboard electronic components in the smart glasses can allow for increased data transfer rates from the smart glasses (e.g. data transferred via WiFi or other communication modalities).

This disclosure applies to small form factor devices including smart glasses (e.g., those that carry electronics). Smart glasses include onboard electronic components such as a power source, power and communication related circuitry, communication devices (e.g., a camera, a microphone, or sensors), display devices, a computer, a memory, modules, and/or the like.

In an example embodiment, the smart glasses comprise an eyewear body configured for wearing by a user to hold one or more optical elements mounted on the eyewear body within a field of view of the user. Such optical elements can include not just lenses, but may in some embodiments comprise any object that can be held close to the eye and through which or from which light is passed to the eye not only lenses (which may be corrective or non-correct, colored or non-colored, but also includes various other optical elements. Such optical elements therefore can include displays, virtual reality displays, near-eye display surfaces such as those of a smartphone or tablet, and at least partially transmissive lenses or the like.

The smart glasses include the frame and a pair of the temples coupled thereto on opposite ends of the frame at articulated joints. For any one of the temples, the temple is in the wearable configuration or position when at least one of both temples are substantially fully unfolded for reception along a side of the user's head. In contrast, the temple(s) is in the collapsed configuration or position (also referred to as a stowed configuration or stowed position herein) when the templs is hingedly folded towards the frame. Thus, the smart glasses can be in both the wearable configuration and the collapsed configuration at the same time (e.g., one temple unfolded the other temple folded towards the frame) and the onboard electronics components can be electrically powered so as to be operable in either condition as previously discussed.

FIG. 1 shows a plan view of a front of a pair of smart glasses 12. The smart glasses 12 can comprise an eyewear body 13. The eyewear body 13 can include one or more temples 14A and 14B and a frame 16. The smart glasses 12 can additionally include articulated joints 18A and 18B, onboard electronic components 20A and 20B, and core wires 22A. 22B and 24.

The eyewear body 13 are configured for wearing by a user to hold one or more optical elements mounted on the eyewear body 13 within a field of view of a user. More particularly, the frame 16 holds the one or more optical elements, while the temples 14A and 14B connect to the frame 16 at the respective articulated joints 18A and 18B. The temples 14A and 14B comprise elongate members having core wires 22A and 22B extending therein.

In FIG. 1, the temple 14A is illustrated in the wearable position while the temple 14B is illustrated in the stowed position. As shown in FIG. 1, the temple 14A connects to a right end portion 26A of the frame 16 via the articulated joint 18A. Similarly, the temple 14B connects to a left end portion 26B of the frame 16 via the articulated joint 18B. The right end portion 26A of the frame 16 can carry the onboard electronic components 20A by housing the onboard electronic components 20A therein, and the left end portion 26B can carry the onboard electronic components 20B by housing the onboard electronic components 20B therein.

The core wire 22A comprises a portion of the temple 14A (e.g., is embedded within a plastics material or other material that comprises an outer cap of the temple 14A) and extends longitudinally from adjacent the articulated joint 18A toward a second longitudinal end of the temple 14A.

Similarly, the core wire 22B comprises a portion of the temple 14B (e.g., is embedded within a plastics material or other material that comprises an outer cap of the temple 14B) and extends longitudinally from adjacent the articulated joint 18B toward a second longitudinal end of the temple 14B. The core wire 24 extends from the right end portion (terminating adjacent the onboard electronic components 20A) to the left end portion 26B (terminating adjacent the onboard electronic components 20B).

The eyewear body 13 carries the onboard electronic components 20A and 20B (e.g., either or both of the temple (s) 14A, 14B and/or the frame 16 carry electronics). The onboard electronic components 20A and 20B comprise a heat source that generates heat during electrically powered operation. As previously discussed, the onboard electronic components 20A and 20B can comprise a power source, power and communication related circuitry, communication devices (e.g., a camera, a microphone, sensors, etc.), display devices, a computer, a memory, modules, and/or the like. The power source (e.g., a battery) can be housed within the left end portion 26B of the frame 16 according to some embodiments. The communication devices such as the camera, etc. can be housed within the right end portion 26A of the frame 16 in some embodiments.

The temples 14A, 14B and the frame 16 can be constructed of a plastics material, cellulosic plastic (e.g., cellulosic acetate), an eco-plastic material, a thermoplastic material, or the like in addition to the core wires 22A, 22B and 24. The core wires 22A. 22B and 24 act to provide structural integrity to the eyewear body 13 (i.e. the temple(s) 14A, 14B and/or the frame 16). Additionally, the core wires 22A. 22B and/or 24 act as a heat sink to transfer the heat generated by the onboard electronic components 20A and 20B away therefrom so as to reduce the likelihood of localized heating adjacent the onboard electronic components 20A and 20B. As such, the core wires 22A, 22B and/or 24 are thermally coupled to the heat source to provide a heat sink for the heat source. The core wires 22A. 22B and/or 24 are constructed of a relatively flexible conductive metal or metal alloy material such as one or more of an aluminum, an alloy of aluminum, alloys of nickel-silver, and a stainless steel according to some embodiments.

The temple 14A and core wire 22A extend generally longitudinally rearward from a rear facing surface of the right end portion 26A of the frame 16. According to the illustrated example of FIG. 1, the articulated joint 18A (shown in dashed) comprises a hinge assembly 28 that includes hinge projections configured to mate with one another as illustrated and discussed subsequently. According to other embodiments, the articulated joint 18A can comprise a linkage assembly, a ball joint assembly, a male/female assembly, or another type of mechanical connection that allows for movement of the temple 14A relative to the frame 16.

As will be illustrated subsequently, the articulated joint 18A can also be formed as part of the frame 16 and the temple 14A. Indeed, the articulated joint 18A can provide for movement of the temple 14A relative to the frame 16. Thus, the articulated joint 18A allows for movement of the temple 14A such that it is disposable between the stowed position and the wearable position as illustrated in FIG. 1.

FIG. 2 shows the smart glasses 12 previously described can be used as part of a system such as system 100 to conduct heat generated by the onboard electronic components of the smart glasses 12 into a case 102.

The system 100 includes the case 102 and the smart glasses 12 as illustrated in FIG. 2. In some cases, a cable (not shown) can also be utilized with the system 100. As discussed with regard to previous embodiments, the smart glasses 12 can generally include the frame 16, one or more temples 14A and 14B, and on board electronic components (as illustrated and discussed in previous embodiments); the details of each will not be discussed in great detail as aspects of these items have been previously described.

As shown in FIGS. 2 and 3, the case 102 comprises a body 103 such as a container or holder for the smart glasses 12. In FIGS. 2 and 3, a portion of the case 102 is removed to illustrate the smart glasses 12 and other internal parts of the case 102 and the body 103. According to the embodiment of FIGS. 2 and 3, the body 103 can include a first sidewall 104, a second sidewall 106, a backside wall 108, a cavity 110, a first ledge 112, a second ledge 114, and a first heat conduction pathway 116. The first ledge 112 and/or the second ledge 114 comprise one or more supports 115 for the smart glasses 12 according to the embodiment of FIGS. 2-4. It should be recognized that the one or more supports 115 can comprise other mounting structures such as projections, shaped receptacles, or the like in other embodiments.

The first sidewall 104 is arranged opposing the second sidewall 106. Both the first sidewall 104 and the second sidewall 106 can connect to the backside wall 108 in a spaced apparat relationship. Together the first sidewall 104, the second sidewall 106, the backside wall 108 and other walls of the case 102 define a portion of the cavity 110. The cavity 110 is sized and shaped to receive the smart glasses 12 therein.

In the embodiment of FIGS. 2 and 3, the first ledge 112 is disposed within the body 103 and formed from a portion of the first sidewall 104. The second ledge 114 is positioned across the cavity 110 from the first ledge 112. The second ledge 114 is disposed within the body 103 and formed from a portion of the second sidewall 106. As shown in FIG. 2, the first and second ledges 112 and 114 are each configured to receive a portion of the smart glasses 12 with the smart glasses 12 in the stowed position as shown in FIG. 2. This portion of the smart glasses 12 can comprise backside of each of the right end portion 26A and the left end portion 26B adjacent the articulating joints 18A and 18B.

In some embodiments, such as the embodiment of FIG. 3, the case 102 can include electronic connectors 118. One such of the electronic connector 118 can comprise a base or internal connector (also referred to as a port) on the case 102 such as at one of the first ledge 112 and the second ledge 114. The electronic connector 118 mates or otherwise electronically connects with a complimentary corresponding connector (not shown) on the smart glasses 12. In some embodiments, the electronic connectors 118 are complemented by magnets or other mechanisms for retaining the smart glasses 12 on the second ledge 114 for charging and/or data transfer.

Further details regarding such electronic connectors 118 and the connectors on the smart glasses 12 and discussion of the systems and apparatuses related thereto can be found the Applicant's co-pending U.S. application Ser. No. 14/687,362, entitled "EYEWEAR HAVING LINKAGE ASSEMBLY BETWEEN A TEMPLE AND A FRAME" filed Apr. 15, 2015, co-pending U.S. application Ser. No. 14/687,308, entitled "EYEWEAR HAVING SELECTIVELY EXPOSABLE FEATURE" filed Apr. 15, 2015, and co-pending U.S. application Ser. No. 14/869,149, entitled "EYEWEAR WITH CONDUCTIVE TEMPLE JOINT" filed Sep. 29, 2015; the contents of each of which are hereby incorporated by reference in their entirety.

FIGS. 2 and 3 show the first heat conduction pathway 116 (shown as arrows in FIG. 2), which can be connected both physically and thermally to one or both of first and second ledges 112 and 114. The embodiment of FIGS. 2 and 3 show the first heat conduction pathway 116 connected to both the first and second ledges 112 and 114. The embodiment of FIG. 4 shows a first heat conduction pathway 216 connected to only the first ledge 112.

The first heat conduction pathway 116 can terminate at one or more heat sinks 116A, 116B. These one or more heat sinks 116A, 116B can be located at or closely adjacent to one or both of the first and second ledges 112 and 114 as shown in FIG. 3. According to some embodiments the one or more heat sinks 116A, 116B integrated with the one or more supports 115 (e.g. integrated with one or both of the first and second ledges 112 and 114). Each of the one or more heat sinks 116A, 116B are configured for thermally conductive coupling with a corresponding heat sink of the smart glasses 12 with the heat sink of the eyewear connected in a heat transfer relationship with the heat source of the eyewear device as discussed further subsequently. According to some embodiments the one or more heat sinks 116A, 116B are part of the first heat conduction pathway 116. According to other embodiments, the one or more heat sinks 116A, 116B are separate components from the first heat conduction pathway 116. In either case, the first heat conduction pathway 116 is thermally connected to the one or more heat sinks 116A, 116B.

As shown in FIG. 2, the second temple 14B is connected to the frame 16 at a second articulated joint 18B. A portion (the left end portion 26B) of the frame 16 adjacent the second articulate joint 18B abuts the second ledge 114. As previously discussed, the smart glasses 12 can have second onboard electronic components carried by the frame 14 such as in the left end portion 26B. These onboard electronic components comprise a second heat source that generates heat during electrically powered operation.

The first heat conduction pathway 116 extends into the case 102 and can extend internally within the first sidewall 104 and the second sidewall 106 to the backside wall 108. As shown in FIG. 2, the first heat conduction pathway 116 is thermally coupled to the heat source (shown as arrow A) with the smart glasses 12 disposed on the first and the second ledges 112, 114 to provide a heat sink for the heat source to direct heat into the case 102 and away from the smart glasses 12.

In the stowed position, the smart glasses 12 can be placed in the case 102 as shown in FIG. 2. The smart glasses 12 can be operable (i.e. are electrically powered) even in the stowed position within the case 102. In such stowed position, as well as in the wearable position, the onboard electronic components can run software and perform other tasks that can improve the glasses' efficiency and performance thereby improving the user experience. Indeed, the first heat conduction pathway 116 into the case 102 can allow some tasks such as data transfer to be performed more rapidly than could otherwise be performed in the wearable position. This is because a thermal coupling (further discussed in reference to FIGS. 5A and 5B) that includes the first heat conduction pathway 116 allows for heat conduction between the frame 16 and the case 102, and in some cases, between the frame 16 and one or more of the temples 14A. 14B. This conduction occurs when the temples 14A and 14B are in the stowed position such as shown in FIG. 2 as well as the wearable position partially shown in FIG. 1.

As illustrated in FIGS. 2 and 3, the smart glasses 12 and the case 102 can interact together in various ways and for various purposes. For example, the case 102 can transport and protect the smart glasses 12, can charge or provide power to the electronics incorporated in the smart glasses 12, and/or to communicate with the electronics of the smart glasses 12. Thus, in some embodiments the case 102 can house a supplemental battery to those of the smart glasses 12. Heat can result from the charging of the battery or from powered operation of the onboard electronic components when the temples 14A. 14B are in the stowed position within the case 102. The first heat conduction pathway 116 conducts this heat into the case 102 away from the glasses 12.

The internal connector 118 (FIG. 3) of the case 102 couples to a corresponding electronic connector of the glasses 12 in a manner previously described in Applicant's previously cited co-pending U.S. Patent Applications when the temples 14A and 14B are in the stowed position and docked in the case 102. As such, the interior of the case 102 is shaped to receive the smart glasses 12 only when the temples 14A and 14B are in the stowed position. The shape of the interior also can be such that the electronic connectors 118 of those of the case 102 and of the glasses 12 interface together and are docked with little slippage or movement occurring between the case 102 and the glasses 12. Although illustrated as pogo pin/pad connectors in FIGS. 3 and 4, the connectors can be of virtually any type known in the art for power and/or data communication such as micro-USB, or the like.

FIG. 4 shows a second case 202 of similar construction to that of the case 102 of FIGS. 2 and 3. As such, the details of the features and applications of the case 202 will not be discussed in great detail. The case 202 differs from case 102 in that the first heat conduction pathway 216 has a different construction from that of the first heat conduction pathway 116 of FIGS. 2 and 3. More particularly, the first conduction pathway 216 connects only to the first ledge 112 (shown in phantom). This first ledge 112 interfaces with a portion of the frame that houses the camera and other communication devices (e.g., a microphone, sensors, etc.) that can generate a substantial portion of the total heat generated by the onboard electronic components.

As shown in FIG. 4, parts of the first sidewall 104 and the backside wall 108 are removed to better illustrate the first heat conduction pathway 216. The first heat conduction pathway 216 includes a heat spreader 220 disposed internally within the backside wall 108 of the case 202. The heat spreader 220 comprises one or more of a copper heat sink, an aluminum heat sink, a graphite heat sink, and a heat pipe. The relatively larger surface area of the heat spreader 220 allows for increased rate of heat transfer into the case 202.

The heat pipe, if used, can have a hollow central cavity surrounded by an exterior housing. The hollow cavity contains a working fluid (e.g., deionized water). The working fluid is evaporated to a vapor at the first end portion adjacent the heat source. The vapor travels the length of the heat pipe from a first end portion to second end portion. At the second portion adjacent the heat sink, the vapor condenses back to fluid and the heat is released to the heat sink. The fluid is absorbed back into a wick that extends substantially the length of the heat pipe. The working fluid travels the length of the wick back from the second end portion to the first end portion to repeat the cycle described above. Further details regarding the construction of the heat pipe can be found the Applicant's co-pending U.S. application Ser. No. 15/084, 683, entitled "WEARABLE DEVICE WITH HEAT TRANSFER PATHWAY" filed Mar. 30, 2016, the contents of which are hereby incorporated by reference in their entirety.

As shown in FIG. 4, the first heat conduction pathway 216 includes a metal strip 222 imbedded in the first sidewall 104 of the case 202. The metal strip 222 couples to the first ledge 112 and interfaces with a portion of the smart glasses. This interface can occur in a part of an articulate joint between a temple and a frame as will be further described in reference to FIGS. 5A and 5B. As shown in FIG. 4, the metal strip 222 extends internally along the backside wall 108 and connects to the heat spreader 220.

FIGS. 5A and 5B show a portion of the frame 16 of the smart glasses 12 along with a portion of the core wire 22A and temple 14A from various perspectives. FIGS. 5A and 5B also highly schematically illustrate a first heat conductive pathway 316 and a first ledge 112, the construction of which has been previously discussed in reference to FIGS. 2-4. As discussed with reference to FIG. 3, the first heat conductive pathway 316 can terminate at one or more heat sinks 316A. The embodiment of FIGS. 5A and 5B illustrate the first heat conductive pathway 316 and one or more heat sinks 316A are part of a thermal coupling 302 that is formed by parts of the smart glasses 12 and the case 102 or 202. The thermal coupling 302 can include the first heat conductive pathway 316, a second heat conductive pathway 318 and various components of the smart glasses 12.

FIG. 5A shows an enlarged view of the right end portion 26A of the frame 16, the articulated joint 18A, the onboard electronic components 20A, the temple 14A and the core wire 22A. FIG. 5A also illustrates components of the hinge assembly 28 including a cap hinge 30 and a temple hinge 32.

As shown in the example of FIG. 5A, the onboard electronic components 20A are located within the frame 16. Thus, the heat source is located within the frame 16. In particular, the onboard electronic components 20A are housed within a cavity in the right end portion 26A of the frame 16. According to one example, this cavity can encompass a small volume (e.g., the cavity can be is ~17 mm long). Thus, in order to dissipate the heat more evenly and effectively, the thermal coupling 302 can be used to direct heat away from the onboard electronic components 20A and a housing 33 that forms and encases the cavity and the onboard electronic components 20A. The thermal coupling 302 can direct heat to the core wire 22A (a heat sink) and/or the first heat conductive pathway 316 as previously discussed.

Together, components of the hinge assembly 28 form the second heat conductive pathway 318 (a part of the thermal coupling 302 in addition to the first heat conductive pathway 316). The second heat conductive pathway 318 comprises at least a second heat sink (after the core wire 22A) for the heat source. The second heat conductive pathway 318 extends between the heat source and the core wire 22A across the articulated joint 16A between the temple 14A and the frame 16.

As the thermal coupling 302 can be comprised of components of the hinge assembly 28 as well as the case 102 or 202, the thermal coupling 302 can be configured to conduct heat across the articulated joint 18A both when the temple 14A is in the wearable position (via the second heat conductive pathway 318) and when the temple is in the stowed position (via one or both of the first heat conductive pathway 316 and/or the second heat conductive pathway 318). Thus, according to the embodiment of FIG. 5A, the core wire 22A is thermally coupled to the heat source by the second heat conduction pathway 318 to provide a heat sink for the heat source. The first heat conduction pathway 316 and the second heat conduction pathway 318 are part of the thermal coupling 302 to conduct heat to adjacent and across the articulated joint 18A when the temple 14A is in the stowed position, and indeed, when the temple 14A and the frame 16 are received in the case 102 or 202.

The cap hinge 30 can form a portion of the second heat conductive pathway 318 and can additionally form a portion of the frame 16 and the hinge assembly 28. More particularly, the cap hinge 30 can have a first portion 37 integrally formed with the housing 33 of the frame 16 and has a second portion 40 comprising a projection extending from the frame 16 and the first portion 37. As is illustrated in FIGS. 5A and 6, one or more heat sinks internal to the frame 16 abut the cap hinge 30 along one or more internal surfaces disposed within the frame 16. The first ledge 112 and the first heat conduction pathway 316 can abut the one or more external surfaces 36 of the cap hinge 30.

The temple hinge 32 forms a portion of the second heat conductive pathway 318 and additionally forms a portion of the temple 14A and the hinge assembly 28. Thus, the temple hinge 32 can comprise a fourth heat sink (in addition to at least the core wire 22A, the cap hinge 30 and the first heat conductive pathway 316). The temple hinge 32 couples to the core wire 22A in a conductive heat exchange relationship. In some embodiments, the first heat conductive pathway 316 abuts the temple hinge 32 in a conductive heat exchange relationship. According to one example embodiment, the core wire 22A can be soldered or otherwise connected to the temple hinge 32 in a solid heat conductive manner. The temple hinge 30 can be connected to the cap hinge 32 via a metal screw or fastener (shown in FIG. 5B).

FIG. 5A illustrates a heat flow via conduction along the second heat conduction pathway 318 and the first heat conduction pathway 316 (illustrated by arrows) where heat generated by electrical powered operation of the onboard electronic components 20A is conducted away therefrom via one or more heat sinks internal to the frame 16. The heat is conducted to the cap hinge 30, to the first heat conductive pathway 316 in the case 102, 202, through the screw (see FIG. 5B), and the temple hinge 32 to the core wire 22A within the temple 14A. Thus, the thermal coupling 302 can be configured such that the heat from the onboard electronic components 20A can be conducted to the cap hinge 30, to the case 102, 202 via the first heat conductive pathway 316, through the screw and temple hinge 32 to the core wire 22A within the temple 14A according to some embodiments. According to other embodiments only one of the first heat conductive pathway 316 and the second heat conductive pathway 318 can be utilized rather than both being utilized as described in the embodiment of FIG. 5A.

FIG. 5B shows an enlarged view of the right end portion 26A of the frame 16, the articulated joint 18A, the onboard electronic components 20A, the temple 14A, the core wire 22A, the hinge assembly 28, the first ledge 112, the first heat conductive pathway 316, the second heat conductive pathway 318 and the thermal coupling 302 from a rear position. The temple 14A is shown in phantom in FIG. 5B to better illustrate the cap hinge 30, the screw 31, the temple hinge 32 and the core wire 22A. Portions of the housing 33 are removed to better illustrate the cap hinge 30.

FIG. 5B shows the cap hinge 30 in further detail. For example, the first portion 37 including the external surfaces 36 can have a relatively large surface area comprised of opposing relatively flat surfaces that can take up most of the rear-facing portion of the right end portion 26A of the frame 16. Such relatively large surface area provides a sufficient area for heat transfer purposes. The first portion 37 can include apertures therein. These apertures can be used for convection heating of the onboard electronic components 20A in some embodiments. In other cases, the apertures can be used to facilitate electrical communication via wire or can simply be used to reduce the weight of the cap hinge 30. The second portion 40 of the cap hinge 30 comprising projections are received in corresponding projections 48 of the temple hinge 32. The second portion 40 and the projections 48 can be configured to receive the screw 31 therein.

FIG. 5B illustrates the conduction of heat along the first heat conduction pathway 316 and the second heat conduction pathway 318 as previously discussed and illustrated in reference to FIG. 5A. As such, the heat generated by electrical powered operation of the onboard electronic components 20A is conducted away therefrom via one or more heat sinks internal to the frame 16. The heat is conducted (indicated by arrows) to the cap hinge 30, the first heat conductive pathway 316, through the screw 31, and the temple hinge 32 to the core wire 22A within the temple 14A. Thus, the thermal coupling 302 can be configured such that the heat from the onboard electronic components 20A can be conducted to away therefrom and indeed from the smart glasses 12 to the case 102 or 202 as previously discussed.

FIG. 6 shows portions of the frame 16 with the housing 33 (FIG. 5A) and components of the temple 14 (FIG. 5A) removed. In particular, FIG. 6 shows the onboard electronic components 20A, a first internal heat sink 50, a second internal heat sink 52, and the cap hinge 30 arranged together.

The first internal heat sink 50 and the second internal heat sink 52 abut the cap hinge 30 can be abutted along one or more internal surfaces 54 disposed within the frame 16. This forms a conductive heat exchange relationship. The first internal heat sink 50 and the second internal heat sink 52 can be entirely internal to the frame 16 (i.e. can be disposed within the housing 33 of FIG. 5A). Similarly, the onboard electronic components 20A can be disposed entirely within the frame 16 (i.e. can be disposed within the housing 33 of FIG. 5A) and can carried by the first internal heat sink 50 and the second internal heat sink 52.

The first internal heat sink 50 can be spaced from the second internal heat sink 52. According to the example of FIG. 6, the first internal heat sink 50 can extend generally longitudinally and can extend generally parallel with the second internal heat sink 52. The first internal heat sink 50 can hold and wrap around various boards and/or modules that comprise some of the onboard electronic components 20A. Similarly, the second internal heat sink 52 can hold and sandwich various boards and/or modules that comprise some of the onboard electronic components 20A. In the example of FIG. 6, the second internal heat sink 52 can extend longitudinally from the cap hinge 30 to abut an image sensor 56 of a camera 58. As discussed previously, the first internal heat sink 50 and the second internal heat sink 52 can act to conduct heat away from the onboard electronic components 20A to the cap hinge 30 and onward to the core wire 22A (FIGS. 1, 5A and 5B).

According to one example, the one or more internal surfaces 54 of the cap hinge 30 can have a thermal interface material (TIM) disposed on them. The TIM can help to provide good thermal contact between the cap hinge 30 and the first internal heat sink 50 and the second internal heat sink 52. The first internal heat sink 50 and the second internal heat sink 52 can additionally utilize TIMs to provide for good thermal contact between the first internal heat sink 50 and the second internal heat sink 52 and the onboard electronic components 20A (e.g., the processor, the WiFi module, the memory, and the image sensor 56). All of these contacts via TIMs allow for heat to be moved rearward through the first internal heat sink 50 and the second internal heat sink 52 to the cap hinge 30 and on to the core wire 22A (FIGS. 1, 5A and 5B).

According to one embodiment, a case for a wearable device is disclosed. The case can include one or more supports disposed within the case and configured to receive a portion of the wearable device thereon. The wearable device can include an eyewear body carrying onboard electronic components that comprise a heat source that generates heat during electrically powered operation. The case can further include a first heat conduction pathway connected to the one or more supports and extending into the case. The first heat conduction pathway can be thermally coupled to the heat source with the eyewear body disposed on the one or more supports to provide a heat sink for the heat source to direct heat into the case and away from the eyewear body.

Language

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

What is claimed is:

1. A case for eyewear device having an eyewear body carrying onboard electronic components that comprise a heat source that generates heat during electrically powered operation thereof, the case comprising:
    a case body having a hollow interior defining a holding space configured for holding the eyewear device;
    one or more supports defined by the interior of the case body and configured for engagement with a portion of the eyewear device to support the eyewear device in a stowed position within the holding space;
    one or more heat sinks housed by the case body and thermally conductively coupled in a heat transfer relationship with the heat source of the eyewear device; and
    a first heat conduction pathway thermally connected to the one or more heat sinks and extending into the case body, the first heat conduction pathway thereby conducting heat from the heat source into the case body when the eyewear device is supported in the stowed position.

2. The case of claim 1, wherein the first heat conduction pathway includes a heat spreader disposed internally within a wall of the case body at a back portion thereof.

3. The case of claim 2, wherein the heat spreader comprises one or more of a copper heat sink, an aluminum heat sink, a graphite heat sink, and a heat pipe.

4. The case of claim 2, wherein the first heat conduction pathway includes a metal strip imbedded in a wall of the case body, the metal strip thermally coupled to the one or more heat sinks and configured to interface with a portion of the eyewear body that comprises part of an articulated joint between a temple and a frame of the eyewear body.

5. The case of claim 1, wherein the one or more heat sinks are integrated with the one or more supports, each of the one or more heat sinks being configured for the thermally conductive coupling with a corresponding heat sink of the eyewear device, wherein the heat sink of the eyewear device is connected in a heat transfer relationship with the heat source of the eyewear device.

6. A system including a wearable device, the system comprising:
    smart glasses comprising:
        a frame,
        an elongated temple connected to the frame at an articulated joint between the temple and the frame,
        onboard electronic components carried by at least one of the frame and the temple, the onboard electronic components comprising a heat source that generates heat during electrically powered operation thereof, and
    a case configured to receive the receive smart glasses therein with the elongated temple disposed in a stowed position relative to the frame, the case comprising:
        one or more supports formed by a body of the case and configured to receive a portion of the smart glasses thereon with the elongate temple in the stowed position relative to the frame; and
        a first heat conduction pathway terminating at one or more heat sinks at or adjacent the one or more supports, the first heat conduction pathway extending into the body of the case, the first heat conduction pathway configured to conduct heat from the heat source into the body of the case when the smart glasses are supported in the stowed position.

7. The case of claim 6, wherein the first heat conduction pathway includes a heat spreader disposed internally within a wall of the body of the case at a back portion thereof.

8. The case of claim 7, wherein the heat spreader comprises one or more of a copper heat sink, an aluminum heat sink, a graphite heat sink, and a heat pipe.

9. The case of claim 7, wherein the first heat conduction pathway includes a metal strip imbedded in a wall of the body of the case, the metal strip thermally coupled to the one or more supports and configured to interface with a portion of the eyewear body that comprises part of the articulated joint between the elongate temple and the frame.

10. The case of claim 6, wherein the elongate temple includes a core wire that is disposed therein to form part of a structural framework for the temple, the core wire being thermally coupled to the heat source by a second heat conduction pathway to provide a heat sink for the heat source.

11. The wearable device of claim 10, wherein the core wire is located within the temple and extends longitudinally along the temple from a first longitudinal end portion thereof toward a second longitudinal end portion thereof.

12. The case of claim 10, wherein the first heat conduction pathway and the second heat conduction pathway are configured to provide a thermal coupling to conduct heat to adjacent and across the articulated joint when the temple is in the stowed position and the temple and the frame are received in the case.

13. The case of claim 10, wherein the articulated joint comprises a hinge assembly including a cap hinge that comprises a portion of the thermal coupling, the cap hinge forms a portion of the frame and the hinge assembly, and wherein the cap hinge is an integrally formed portion of a casing of the frame and has a portion extending therefrom, the cap hinge is abutted along one or more internal surfaces disposed within the frame in a conductive heat exchange relationship by one or more heat sinks internal to the frame and is configured to be abutted along one or more external surfaces by at least one of the one or more heat sinks of the first heat conduction pathway.

14. The case of claim 10, wherein the one or more supports comprise a first ledge on a first sidewall of the case and a second ledge on a second sidewall of the case and the wearable device further includes:
    a second temple connected to the frame at a second articulated joint, a portion of the frame adjacent the second articulate joint configured to abut the second ledge;
    second onboard electronic components carried by the frame and comprising a second heat source that generates heat during electrically powered operation thereof; and
    the first heat conduction pathway is connected to both the first ledge and the second ledge and extends to a back portion of the case, the first heat conduction pathway thermally coupled to both the heat source and the second heat source with the eyewear body disposed on the first and second ledges to provide the heat sink for the heat source and the second heat source to direct heat into the case and away from the frame.

15. The case of claim 14, wherein at least one of the first ledge and the second ledge includes a connector configured to couple with one of a charging or data port of the eyewear body.

16. The case of claim 6, wherein the one or more supports include a connector configured to couple with one of a charging or data port of the eyewear body.

17. In combination a case and smart glasses, the smart glasses carry onboard electronic components that comprise a heat source that generates heat during electrically powered operation thereof, the combination comprising:
   a case body having a hollow interior defining a holding space configured for holding the smart glasses when the smart glasses are in a stowed position;
   a first ledge disposed at a first end of the case body and configured to receive a first end portion of the smart glasses thereon with the smart glasses in the stowed position;
   a second ledge disposed at a second end of the case body and configured to receive a second end portion of the smart glasses thereon with the smart glasses in the stowed position;
   a connector disposed at least one of the first ledge and the second ledge, the connector configured to couple with one of a charging or data port of the smart glasses; and
   a first heat conduction pathway terminating at one or more heat sinks at or adjacent the at least the first ledge, the first heat conduction pathway extending into the case body, the first heat conduction pathway configured to conduct heat from the heat source into case body when the smart glasses are supported in the stowed position.

18. The case of claim 17, wherein the smart glasses comprise:
   a frame configured to hold one or more optical elements; and
   an elongate temple connected to the frame at an articulated joint, the temple includes a core wire that is disposed therein to form part of a structural framework for the temple, the core wire being thermally coupled to the heat source by a second heat conduction pathway to provide a heat sink for the heat source.

19. The case of claim 18, wherein the first heat conduction pathway and the second heat conduction pathway are configured to provide a thermal coupling to conduct heat to adjacent and across the articulated joint when the temple is in the stowed position and the temple and the frame are received in the case.

20. The case of claim 19, wherein the articulated joint comprises a hinge assembly including a cap hinge that comprises a portion of the thermal coupling, the cap hinge forms a portion of the frame and the hinge assembly, and wherein the cap hinge is an integrally formed portion of a casing of the frame and has a portion extending therefrom, the cap hinge is abutted along one or more internal surfaces disposed within the frame in a conductive heat exchange relationship by one or more heat sinks internal to the frame and is configured to be abutted along one or more external surfaces by at least one of the first ledge, the second ledge and the first heat conduction pathway.

* * * * *